United States Patent [19]

Butt et al.

[11] Patent Number: 4,769,345
[45] Date of Patent: Sep. 6, 1988

[54] PROCESS FOR PRODUCING A HERMETICALLY SEALED PACKAGE FOR AN ELECTRICAL COMPONENT CONTAINING A LOW AMOUNT OF OXYGEN AND WATER VAPOR

[75] Inventors: Sheldon H. Butt, Godfrey, Ill.; Satyam C. Cherukuri, West Haven, Conn.

[73] Assignee: Olin Corporation, New Haven, Conn.

[21] Appl. No.: 25,130

[22] Filed: Mar. 12, 1987

[51] Int. Cl.$^4$ .................. H01L 23/10; H01L 23/04
[52] U.S. Cl. .................. 437/217; 437/218; 437/221; 437/12; 437/939; 174/52 R; 174/50.51; 174/52 S; 357/73; 357/70; 357/78; 29/740
[58] Field of Search .................. 174/52 FP; 220/359; 357/72, 74; 437/217, 213, 220; 29/837, 838, 840

[56] References Cited

U.S. PATENT DOCUMENTS

| | | | |
|---|---|---|---|
| 3,341,369 | 9/1967 | Caule et al. | 420/103 |
| 3,381,080 | 4/1968 | Stelmak | 174/52 FP |
| 3,646,946 | 3/1972 | Ford et al. | 134/3 |
| 3,676,292 | 7/1972 | Pryor et al. | 161/196 |
| 3,698,964 | 10/1972 | Caule et al. | 148/31.5 |
| 3,729,820 | 5/1973 | Ihochi et al. | 174/52 S |
| 3,730,779 | 5/1973 | Caule et al. | 427/248.1 |
| 3,810,754 | 5/1974 | Ford et al. | 75/171 |
| 3,852,148 | 12/1974 | Pryor et al. | 161/41 |
| 3,937,638 | 2/1976 | Plewes | 148/12.7 |
| 4,410,927 | 10/1983 | Butt | 361/386 |
| 4,434,016 | 2/1984 | Saleh et al. | 148/12.7 |
| 4,461,924 | 7/1984 | Butt | 174/52 FP |
| 4,517,584 | 5/1985 | Matsushita et al. | 357/81 |
| 4,542,259 | 9/1985 | Butt | 174/52 FP |
| 4,569,692 | 2/1986 | Butt | 75/235 |
| 4,570,337 | 2/1986 | Butt | 29/840 |
| 4,594,770 | 6/1986 | Butt | 174/52 FP |
| 4,622,433 | 11/1986 | Frampton | 174/52 FP |
| 4,630,095 | 12/1986 | Otsuka et al. | 357/78 |
| 4,656,499 | 4/1987 | Butt | 357/74 |
| 4,663,649 | 5/1987 | Suzuki et al. | 357/67 |

Primary Examiner—Brian E. Hearn
Assistant Examiner—Beverly Ann Pawlikowski
Attorney, Agent, or Firm—Gregory S. Rosenblatt; Paul Weinstein

[57] ABSTRACT

The present invention is directed to a process of forming a package for enclosing an electrical device wherein the enclosure contains a very low amount of oxygen and water vapor. The package includes a base and lid components bonded together by a sealing glass. The lid component contains a gettering alloy from which the oxide layer is removed prior to the final sealing of the package. The gettering alloy forms a refractory oxide layer under an oxide layer formed with the primary constituent of the alloy.

25 Claims, 2 Drawing Sheets

PROCESS FOR PRODUCING A HERMETICALLY SEALED PACKAGE FOR AN ELECTRICAL COMPONENT CONTAINING A LOW AMOUNT OF OXYGEN AND WATER VAPOR

This application relates to U.S. patent application Ser. No. 413,046 entitled "MULTI-LAYER CIRCUITRY" by Sheldon H. Butt, corresponding to EPO Publication No. 0101791; U.S. patent application Ser. No. 707,636, entitled PIN GRID ARRAY, by M. J. Pryor (now abandoned), corresponding to EPO Publication No. 193782; U.S. patent application Ser. No. 710,777 ('777) entitled "Hermetically Sealed Semiconductor Package" by M. J. Pryor et al.; U.S. patent application Ser. No. 811,846, entitled "METAL-GLASS LAMINATE" by Charles J. Leedecke et al.; U.S. patent application Ser. No. 811,905, entitled "HYBRID AND MULTI-LAYER CIRCUITRY" by Michael J. Pryor et al.; U.S. patent application Ser. No. 811,906, entitled "MULTI-LAYER AND PIN GRID ARRAYS" by Michael J. Pryor; U.S. patent application Ser. No. 811,907, entitled "HYBRID AND MULTI-LAYER CIRCUITRY" by Michael J. Pryor et al.; U.S. patent application Ser. No. 811,910, entitled "A METHOD OF JOINING METALLIC COMPONENTS" by Michael J. Pryor et al.; U.S. patent application Ser. No. 811,911, entitled "A HERMETICALLY SEALED PACKAGE" by Michael J. Pryor et al.; U.S. patent application Ser. No. 838,866, entitled CERMET SUBSTRATE WITH GLASS ADHESION COMPONENT by D. Mahulikar (now abandoned); U.S. patent Ser. No. 838,967 entitled CERMET SUBSTRATE WITH SPINEL ADHESION by M. J. Pryor et al.; U.S. patent application Ser. No. 922,271, entitled CERMET SUBSTRATE WITH GLASS ADHESION COMPONENT by D. Mahulikar; U.S. patent application Ser. No. 924,959, entitled PRODUCTS FORMED OF CERAMIC-GLASS-METAL COMPOSITES by N. N. SinghDeo et al.; U.S. patent application Ser. No. 924,968, entitled CERAMIC-GLASS-METAL COMPOSITE by Mahulikar et al.; U.S. patent application Ser. No. 924,970, entitled ELECTRONIC PACKAGING OF COMPONENTS INCORPORATING A CERAMIC-GLASS-METAL COMPOSITE by N. N. SinghDeo et al.; U.S. Pat. No. 4,491,622, entitled "COMPOSITES OF GLASS-CERAMIC TO METAL SEALS AND METHOD OF MAKING THE SAME" by Sheldon H. Butt; and U.S. patent application Ser. No. 4,469, entitled "CERAMIC-GLASS-METAL PACKAGING FOR ELECTRONIC COMPONENTS INCORPORATING UNIQUE LEADFRAME DESIGNS" by Butt et al.

While the invention is subject to a wide range of applications, it is especially related to the method of fabricating hermetically sealed semiconductor packages wherein a metallic gettering component is provided in a hermetically sealed enclosure to significantly reduce the amount of oxygen and water vapor in the package. The gettering component reacts with the gas constituents within the enclosure at the times and temperatures of the glass sealing operations. The invention is directed to forming the gettering alloy from glass sealable alloys capable of forming a refractory oxide layer.

Hermetically sealed packages are used in applications requiring maximum reliability. These packages, typically of glass sealed ceramic or metal components, form an enclosure to house one or more electrical devices, such as semiconductor devices. The enclosure is substantially impervious to the diffusion of water vapor or other contaminants.

Low moisture content in the enclosed cavity of hermetic semiconductor packages is desired to avoid condensation of water vapor within the cavity when the package is exposed to low operating temperatures. Low moisture content is particularly desired in devices intended for use in aircraft applications since these devices, when located in an unheated area within an aircraft, may be subjected to temperatures far below 0° C. Based on the prior art glass sealed ceramic semiconductor packages, the water vapor content of the atmosphere within the package cavity is typically held to a maximum of about 5,000 parts per million (ppm). At present, there is an effort to reduce the maximum permissible water vapor content to 2,500 ppm. This level is still sufficiently high so that condensation of moisture will occur within the package at temperatures substantially in excess of those which the package devices may encounter in service. It is believed that the rather high water vapor content of the atmosphere trapped within the package results from a combination of circumstances, notably moisture evolving from the sealing glass during the sealing operation and moisture generated as the result of reaction between organic binders used in formulating the glass frit and oxygen within the package. Since the dew point of the water vapor in the package, even at a water vapor content of 2,500 ppm is still substantial, it is obvious that still lower water vapor contents are desirable.

It is important that the sealing temperature of glasses used in glass sealed hermetic packages be relatively low in order to avoid damage to the semiconductor device during the glass sealing procedure. The requirement for a low sealing temperature, as well as for other needed characteristics, severely restricts the choice of glass compositions. Thus, it has not been possible for glass manufacturers to formulate glasses which will not evolve significant amounts of water vapor during the glass sealing operation. Water vapor attributable to the binders used in the glass formulation can be minimized or eliminated by careful selection of the binder material, by reducing the amount of binder used or even eliminating the use of a binder. However, elimination of the binder will still leave behind a substantial amount of water vapor attributable to the glass itself. Therefore, in order to reduce the water vapor content of semiconductor packages, it is necessary to devise a means of "gettering" within the package.

It is also desired to decrease or eliminate oxygen from the enclosure containing the electronic device within the semiconductor package. Oxygen present within the enclosure may react with metallic circuit traces on the face of the semiconductor device to effectively reduce their electrical cross section by gradually increasing the thickness of oxide films upon the surface of these traces. Significant interdiffusion of external hydrogen into the package may occur over time, reflecting the relatively small size of the hydrogen molecule. In such an event, hydrogen entering the package may react with residual oxygen forming new water vapor within the package.

Circuit elements upon the semiconductor device are produced from elements such as aluminum, which will corrode in the presence of water and which may short out in the presence of water.

Upon the basis of these considerations, it is desirable to reduce and if possible eliminate both oxygen and water vapor from the atmosphere within the package cavity. At least, it is advantageous to reduce the water vapor content in the cavity to a low enough level that condensation will not occur. Thus, the ideal "getter" for use within a semiconductor package is one which will eliminate both oxygen and water vapor. The "gettering" reactions should not be reversible at the maximum temperatures which the device may reach in service.

One means of reducing oxygen and water vapor from within the semiconductor package is by providing a metallic internal surface in the package which will react to form metal oxide films upon the surface of the metallic "getter". The choice of metals and metal alloys which may effectively perform this function is limited by the following considerations. The metal or alloy surface available for the oxidizing reaction is limited to the relatively small area circumscribed by the geometry of the package.

Typically, package components are pre-fired with a glass frit adhered thereto at a substantially lower temperature than the final sealing temperature. The glass frit is sufficiently sintered to generate the required strength to permit handling of the components during package assembly. The use of metal such as aluminum and its alloys as a getter is found to be relatively ineffective. At the initial sintering temperature, as well as during exposure to the air at ambient temperature before sintering, metal such as aluminum and its alloys form adherent refractory films which act as diffusion barriers limiting further reaction with oxygen and water vapor.

Moreover, the heating time of the gettering alloy is limited. Exposure of the device during assembly to the elevated temperatures required for glass sealing must be limited to a period no greater than that required to effect a glass seal. The longer the exposure to elevated temperature during sealing, the greater the interdiffusion of the dopants forming the semiconductor device will be, and consequently, the shorter the life expectancy of the packaged device.

It is known, in the prior art to form a semiconductor package which incorporates a getter material as shown in U.S. Pat. No. 4,630,095. That patent is directed to the placement of an organic shielding material on the semiconductor chip and then providing a gettering material within the package to getter the gas produced by the organic shielding material during the sealing process. This concept differs from the present invention where the gettering material is provided to reduce the amount of oxygen and water vapor in the enclosure of the semiconductor package.

Metallic elements, such as copper, nickel and iron, and many of their alloys, form adherent oxide films which are not very effective as diffusion barriers and which will permit continuing oxidation upon reheating following the initial glass sintering operation. Thus, they offer a means of gettering oxygen from the atmosphere remaining in the package during the final sealing operation. However, metallic elements such as these and most of their alloys do not prevent the formation of water vapor within the range of temperatures defined by the semiconductor package sealing cycle.

Accordingly, the present invention is directed to providing gettering materials in the enclosed cavity of a package for electronic devices which are able to both reduce the amount of oxygen as well as water vapor the same processing conditions used to assemble the packages. These materials are preferably alloys which form a continuous refractory oxide layer under an oxide layer of the main constituent of the alloy. Examples of packages which are thought to meet these qualifications are disclosed in U.S. patent application Ser. No. 710,777 and U.S. application Ser. No. 2,532. The packages and processes disclosed in these applications differ from the present invention because of not including the processing step of removing the oxide layer from the lid component subsequent to sintering a glass coating thereon or forming the package components of different materials.

It is an aim of the present invention to provide a hermetically sealed package and process for making the package wherein the cavity containing an electrical device has extremely low levels of oxygen and water vapor.

It is a further aim of the present invention to provide a hermetically sealed package and process for making the package wherein the process for removing the oxygen and water vapor from the cavity containing an electrical device is accomplished in the times and temperature regime needed to seal the package.

It is a yet further aim of the present invention to provide a hermetically sealed package and process for making the package wherein the removal of the oxygen and water vapor from the cavity containing an electronic device can be accomplished using a low cost, efficiently operated process.

Accordingly, there is disclosed a process of forming a package for enclosing an electrical device wherein the enclosure contains a very low amount of oxygen and water vapor. The package includes a base and lid components bonded together by a sealing glass. In one embodiment, the lid component contains a gettering alloy from which the oxide layer is removed prior to the final sealing of the package. The gettering alloy forms a refractory oxide layer under an oxide layer formed with the primary constituent of the alloy.

These and other aims will become more apparent from the following description and drawings in which like elements have been given like reference numerals and in which primed or multiprimed numbers comprise similar elements providing similar functions.

Figure 1:
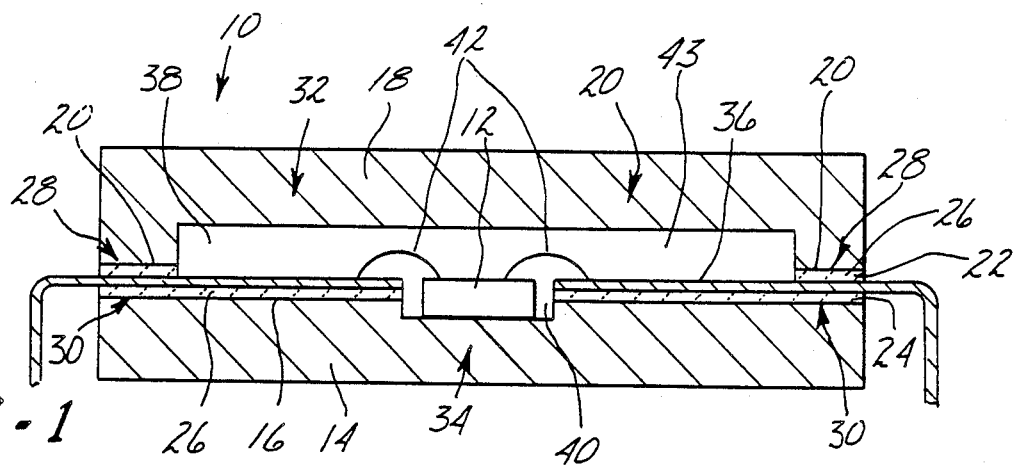
FIG. 1 illustrates a cross section of a hermetically sealed metallic electronic device package based on the inventive concepts set forth in the present specification.

Referring to FIG. 1, the process of forming a package 10 for enclosing an electronic device 12 can be readily understood. A base component 14 has a first surface 16 and a lid component 18 has a first surface 20. Coatings 22 and 24 of the sealing composite 26 are coated about the peripheral portions 28 and 30, respectively, on the first surfaces 20 and 16 of the lid and base components 18 and 14, respectively. The coatings leave uncoated areas 32 and 34 on the lid 18 and the base 14, respectively. The coatings 22 and 24 of the sealing glass composite 26 are sintered to the lid 18 and base 14. A leadframe 36 is disposed on the first surface 16 of the base component 14. The assembly of the base component 14 and the leadframe 36 are heated whereby the glass coating 24 melts into a continuous glaze which bonds the leadframe 36 to the base component 14. Then, the oxide layer formed on the uncoated area of the lide component 18 is removed subsequent to the sintering step. The electrical component 12 is then electrically interconnected to the leadframe 36. Next, the lid component 18 is stacked on the assembly of the leadframe 36 and the base component 14 to form an enclosure 38 in which the electrical device 12 is disposed. The lid and base components 18 and 14, respectively, are stacked so that the glass coating 22 of the lid component 18 contacts the glass coating 24 of the base component 14. Then, the resulting assembly of the lid and base components 18 and 14, respectively, is heated to melt the glass coatings and hermetically seal the electrical device 12 within the enclosure 38. The latter heating step is for a period of time whereby the contact of the gas constituents and the gettering alloy within the enclosure 38 reduces the amount of oxygen and water vapor within said enclosure 38 to less than about 100 parts per million and 1000 parts per million, respectively, of the gas constituents.

There are several characteristics of metals and metal alloys for use in semiconductor packages to getter water vapor and oxygen. These characteristics include not forming substantially self-limiting continuous refractory oxide films upon their surface during the initial glass sintering operation; and subsequent to the glass sintering step, oxidizing or continuing to oxidize during the final sealing operation whereby a very small amount of oxygen and water vapor remain within the package cavity subsequent to sealing.

Certain types of copper-base, nickel-base and iron-base alloys are preferred for carrying out the present invention. These are relatively dilute alloys in which the major constituent, such as copper, nickel or iron, behave as a "conventional" alloy at moderate temperatures. That is to say, the oxide films which develop are predominately base metal oxide films which are not self-limiting. A self-limiting oxide film being defined as one which does not permit continuing interdiffusion and continuing growth of the base metal oxide layer. As the temperature to which the metal or alloy being treated is increased, diffusion of the more active constituent, such as aluminum, titanium, silicon, chromium, etc., to the surface accelerates. As the reactive element reaches the alloy surface, it is thought to react with any remaining oxygen and possibly with the water vapor remaining after the oxygen has been consumed, to form an inner refractory oxide film. The resulting inner refractory oxide film, formed under the base metal oxide film, is self-limiting. However, since most or all of the oxygen originally present in the atmosphere has now been consumed by reaction with the base metal, it is only necessary that sufficient reactive metal oxide forms to reduce the final amount of oxygen and water vapor in the package to the desired level, i.e., less than about 100 ppm and 1000 ppm, respectively.

In effect, the oxidation behavior of the required alloy is that, upon initial heating, a base alloy oxidation film is formed and as the temperature begins to rise, a refractory oxide film is formed under the base alloy oxidation film, yielding a duplex alloy film upon the alloy. Examples of such alloys are Copper Alloys C63800, C72400 and C70250. Examples of C63800 are disclosed in U.S. Pat. Nos. 3,341,369 and 3,676,292. An example of a nickel-base alloy in this category is described in U.S. Pat. No. 3,810,754. Examples of an iron-base alloy in this category is described in U.S. Pat. Nos. 3,698,964 and 3,730,779.

Upon heating the alloy up to about 350° C., C63800 and C72400, for example, oxidize in a manner typical of other copper alloys and form a predominantly copper oxide surface film which is not self limiting. At temperatures in excess of about 350° C., diffusion of aluminum to the surface of the alloy becomes sufficiently rapid that a continuous and ultimately self-limiting film of aluminum oxide develops under the copper oxide film, by reaction with oxygen. The oxidation behavior may be characterized as a two-step process. In each case, the alloy system chosen must be one in which there is sufficient solid solubility of the reactive element in the base metal matrix to permit reasonably rapid diffusion of the reactive element from the bulk alloy to the surface. Alloys containing alloying elements of the group consisting of aluminum, silicon, chromium, beryllium, titanium, gallium, indium, tin, calcium, strontium, barium, and combinations thereof, in addition to the base alloy of copper, aluminum, iron and combinations thereof, fulfill this requirement. The alloy may, of course, contain more than one of the reactive elements, as in the case of C63800 which contains both aluminum and silicon.

The actual mechanism by which the water vapor within the hermetically sealed semiconductor package is removed is not clearly understood. One possible explanation is that the reactive element in the alloy which reaches the surface reacts with the water vapor and breaks the hydrogen-oxygen bond to form an oxide film with the oxygen. Another possibility is that hydrocarbons formed from the binder in the glass or hydrogen which is released from the glass itself normally mix with the oxygen at the sealing temperatures and form the water vapor. The quick oxidation with the reactive elements of the alloy, such as with the magnesium in the C72400, do not give the water vapor a chance to form. In any case, the experimental data set forth in Table I herein indicates that the final package has extremely low levels of oxygen and water vapor in the hermetically sealed enclosure.

Although the base metal oxide formed initially is not self-limiting in the context of creating a diffusion barrier, as the thickness of base metal oxide increases, the rate at which oxygen will diffuse inwardly to replenish oxygen at the interface where the reactive metal oxide is being formed diminishes. Therefore, an important aspect of the present invention is to take steps to minimize the thickness of the initial base metal oxide layer. For example, the initial glazing step, previously described, in which the glass is sintered at a lower temperature, results in the development of a significant base metal oxide film on the surface of the base metal alloy. This oxide film on the lid 18 and, if desired, on the base component 14 is preferably removed prior to the step of sealing the base and lid components, 14 and 18, respectively. The surfaces having the oxide film removed may be cleaned by any conventional technique, such as with an appropriate pickling solution subsequent to the sintering operation and before the final sealing operation. Another exemplary technique is disclosed in U.S. Pat. No. 3,646,946.

A hermetically sealed package, similar to the type illustrated in FIG. 1, was analyzed as to the gas constituents within the enclosure subsequent to its being sealed. The following results, based on three test samples which did not have the oxide film removed prior to sealing, as set forth in Table 1 were obtained.

TABLE I

| | Concentration of Gas Constituents (Percent by Volume) | | |
|---|---|---|---|
| | Sample Identity | | |
| Constituents | A | B | C |
| Water | .014 | .10 | .05 |
| Nitrogen | 97.00 | 97.00 | 97.00 |
| Helium | ND | ND | ND |
| Fluorocarbon | ND | ND | ND |
| Oxygen | ND | ND | ND |
| Argon | 1.10 | 1.17 | 1.17 |
| Hydrogen | .015 | .022 | .022 |
| Carbon Dioxide | 1.29 | .85 | .89 |
| Methane | ND | ND | ND |
| Organics | ND | ND | ND |
| Amount of Gas (Cubic Centimeters) | .019 | .018 | .018 |

ND = None detected, less than .01

The results of these tests indicate that the use of a gettering alloy in a hermetically sealed package results in less than about 100 ppm of oxygen and less than about 1000 ppm of water vapor. Preferably, there is less than about 150 ppm of water vapor and less than about 100 ppm of oxygen. The intent of the invention is to reduce the oxygen content within the package to a non-detectable level (usually 100 ppm) by conventional mass spectroscopic methods. It can be inferred from these results that removal of the oxide film subsequent to sintering would further reduce the amount of oxygen and water vapor in the hermetically sealed enclosure.

Referring again to FIG. 1, the base and lid components 14 and 18, respectively, are formed of an alloy capable of having a refractory oxide layer thereon, as described previously herein. The base component 14 has a surface 16 upon which a glass layer 24 is applied so as to leave an uncoated area 34 in the middle of the base component 14. This uncoated area 34 may correspond to a cavity 40 which is adapted to receive an electrical device 12, i.e., a semiconductor chip. However, it is also within the terms of the present invention to form the base component 14 without a cavity. The important consideration is that the final package 10 provides the electrical device 12 and the interconnect wires 42 with enough room in the enclosure 38 to prevent contact with the lid component 18.

The lid component 18 is also provided with a glass coating 22 on the surface 20 so as to leave an uncoated area 32 in the middle of lid 18. This uncoated area may correspond to a cavity 43 formed in the lid 18. The surface area of the cavity 43 is preferably maximized to enhance the speed at which the gas constituents in the enclosure 38 are oxidized.

Each of the metals, alloys and other materials of the package components, as previously mentioned, are thought to be glass sealable with any number of sealing glasses. Although the specific sealing glass is not critical to the present invention, it is desirable that it have a coefficient of thermal expansion which closely matches that of the other components of the package. An exemplary glass is a lead borate type glass sealing matrix of the type described in U.S. patent application Ser. No. 888,309. The glass may be applied alone or as a mixture of a low melting point glass matrix and a substantially insoluble, high thermal expansion additive such as calcium fluoride or barium fluoride. Although the lead borate type glasses are preferable, it is within the terms of the present invention to use any glass composition which adequately seals the components of the semiconductor packages described herein.

The preferred metal for fabricating the leadframe 38 is a thermally stable, precipitation hardenable, glass sealable alloy. An example is the Cu-Ni-Al alloy disclosed in U.S. Pat. No. 4,434,016 which is designated as C72400 herein for reference purposes. A description of the characteristics of this material, when incorporated as a leadframe, is disclosed in U.S. patent application Ser. Nos. 2,532 and 710,777.

Referring again to FIG. 1, an exemplary process by which the package or casing 10 is assembled is described. First, the sealing glass composite 26, in powder form is blended with a conventional vehicle to form a sealing glass paste.

The material for the base 14 and lid or cover member 18 is cut and formed to the desired shape. Then, it is cleaned by conventional metal cleaning procedures. The sealing glass 26, in paste form is applied to the base 14 and lid 18 in a conventional screen printing operation. This operation applies the glass in a predetermined pattern around the periphery of the base 14 and lid 18 leaving uncoated areas 34 and 32 in the middle of the base 14 and lid 18, respectively. The glass coated lid 18 and base 14 are heated to remove the vehicle; then heated further to remove the binder; finally heated still further to a temperature in the vicinity of 380° C. to sinter the glass 26 to the base 14 and lid 18. The sintering step takes about 10 to about 30 minutes and, preferably, about 10 to about 20 minutes.

The material for the leadframe 36, as described herein, is prepared and stamped or etched into the desired pattern. The leadframe 36 next is then placed on top of the glass coated base or substrate 14 and the assembly is fired at a temperature of about 400° to about 475° C. for about 30 seconds to about 5 minutes. In this operation, the glass coating flows into a continuous glaze. The leadframe 36 sinks into and bonds to the glass 26 such that glass flows up through the openings in the leadframe 36 but does not cover its upper surface. At this point, a die 12 is attached to the base 14 by any conventional means. The die attach usually involves heating the assembly to a temperature of about 400° to about 450° C. Lead wires 42 are interconnected between the die 12 and the inner ends of the leadframe 36.

The lid component 18 is preferably cleaned to remove the oxidation film formed during the sintering of the glass 26 to the surface 20. The removal of the oxide film may be accomplished by any appropriate means for the particular gettering material. For example, 12% sulfuric acid and 3% hydrogen peroxide would remove an oxide film on C72400. The package 10 is finally sealed by stacking the glass coated lid or cover member 18 onto the base and leadframe assembly. The stacked components are then heated to a temperature of about 400° to about 475° C. for about 5 to about 15 minutes to melt the glass 26 between the cover 18 and the base 14 to hermetically seal the package 10.

The alloy surface available for the gettering reactions is basically limited by the required geometry of the package. However, the surface exposed to the gas constituents in the enclosure of the package may be provided with a larger effective surface area by roughening the exposed surface during fabrication of the base and/or lid components. For example, in FIG. 1, the uncoated surface 32 can be roughened by any desired means such as mechanical or chemical i.e., etching.

Figure 2:
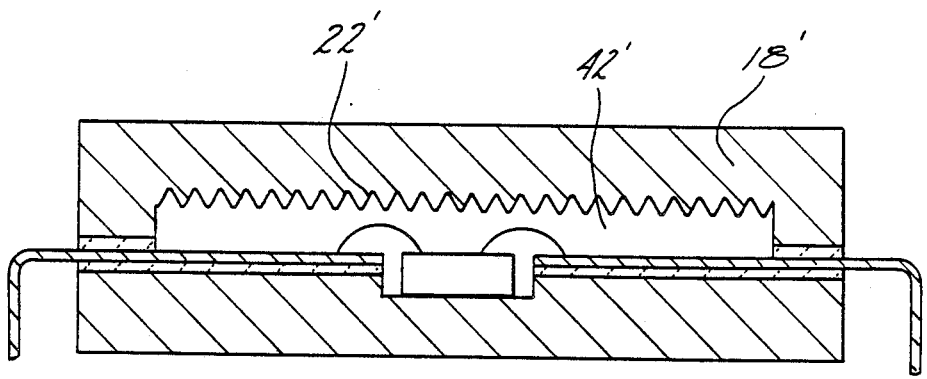
FIG. 2 illustrates a cross section of a second embodiment of a hermetically sealed metallic electronic device package based on the inventive concepts set forth in the present specification.

Referring to FIG. 2, a lid 18' is formed by milling a recess 42' in the metal lid 18'. The milled recess defines the surface available for reaction. The milling cutter may be modified such that the milled surface 22' is grooved rather than planar, as in FIG. 1. The effect is to increase the surface available for the oxidation reaction.

Figure 3:
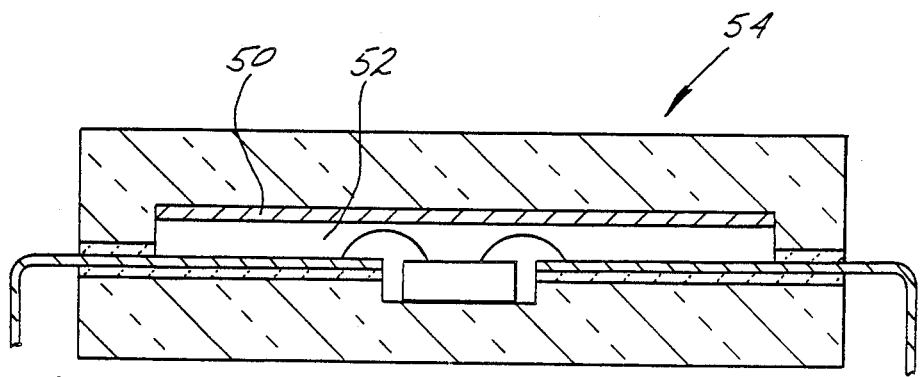
FIG. 3 illustrates a cross section of a third embodiment of a hermetically sealed ceramic electronic device package based on the inventive concepts set forth in the present specification.

Materials suitable for forming the semiconductor package components, other than the leadframe, include any material, such as metals, alloys and ceramics, cermets, ceramic-glass, and ceramic-glass-metal composites which can be hermetically sealed with a sealing glass. As illustrated in FIG. 3, the gettering alloy in the form of a coupon or strip 50 of the gettering alloy can be affixed into the enclosure 52 of the hermetically sealed package 54 using any desired means, such as embedding the manufacturing process used to form the lid. Examples of material for the base and lid include any desired ceramic such as $Al_2O_3$, $Si_3N_4$ and AlN. The present invention is particularly useful for ceramic packages into which hydrogen diffusion may be substantially greater than in metal packages. In addition, ceramic-glass-metal composites as disclosed in U.S. patent application Serial Nos. 924,959, 924,968 and 924,970 may be incorporated. Also, cermet materials including those described in Ser. Nos. 838,967 and 922,271 are thought to be applicable. Still other materials which may be applicable are disclosed in U.S. Pat. No. 4,569,692.

Figure 4:
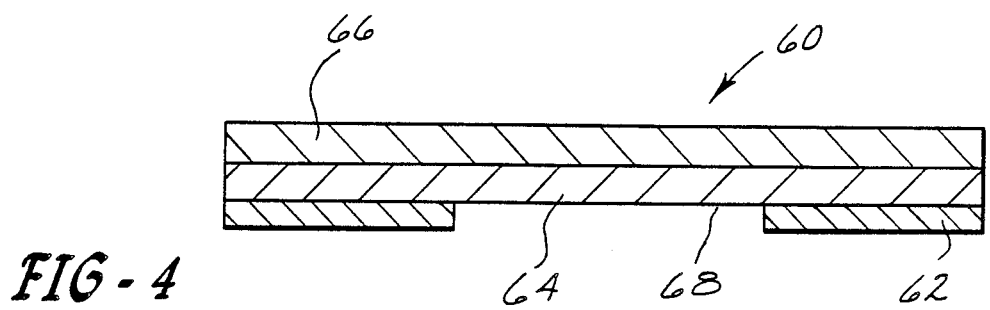
FIG. 4 illustrates a cross section of a tri-clad lid component in accordance with the inventive concepts set forth in the present specification.

A third embodiment illustrated in FIG. 4, provides the lid component 60 of a tri-clad material. The clad layer 62 is formed of any metal or alloy material which is glass sealable. The gettering layer 64 is formed of a suitable alloy of the type described hereinbefore. The third layer 66 may be selected from high thermal conductivity metals and alloys such as copper, iron, aluminum, nickel and alloys thereof. It is also within the terms of the present invention to delete the third layer 66 so that the lid component is a bi-clad. As explained above, the exposed surface 68 of the gettering alloy can be roughened or formed with grooves of any desired shape.

The patents and patent applications set forth in this application are intended to be incorporated in their entireties by reference herein.

It is apparent that there has been provided in accordance with this invention a process for producing a hermetically sealed package for an electrical component containing a low amount of oxygen and water vapor which satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and all variations as fall within the spirit and broad scope of the appended claims.

What is claimed:

1. The process of forming a package having a hermetically sealed enclosure containing an electrical device, comprising the steps of:
   providing a base component having a first surface;
   providing a lid component comprised of a gettering alloy having a first surface, said surface oxidized to facilitate bonding;
   providing a sealing glass composite;
   coating the peripheral portion of said first surfaces of said base and lid components with said sealing glass composite leaving an uncoated area in the middle of said first lid and base components;
   sintering the coating of sealing glass composite on said base and lid components;
   providing a leadframe;
   disposing said leadframe on the glass coated surface of said base component;
   heating the assembly of said leadframe and the base component whereby the glass coating melts into a continuous glaze which bonds the leadframe to the base component;
   substantially removing the oxide layer from the uncoated area of the lid component subsequent to the sintering step;
   electrically interconnecting said electrical component to said leadframe;
   stacking said lid component on the assembly of said leadframe and said base component to form the enclosure containing said electrical device, said lid and base components being stacked whereby the glass coating of the lid component contacts the glass coating of the base component; and
   heating the assembly of said lid component, said base component and said leadframe to melt the glass coatings on the base and lid components and hermetically seal said enclosure, said heating step for a period of time whereby contact of the gas constituents and the getting alloy within the enclosure results in the amount to be less than about 100 parts per million and about 1000 parts per million, respectively, of the gas constituents.

2. The process of claim 1 wherein said heating step for hermetically sealing said enclosure being for the period of time so that the amount of water vapor within said enclosure is less than about 150 parts per million of the gas constituents.

3. The process of claim 1 including the step of selecting said gettering alloy of a first alloy capable of forming a continuous refractory oxide layer on its surface, said alloy having the major constituent being selected from the group consisting of copper, nickel, iron and composites thereof whereby a first oxide film formed on the surface of the lid component during the sintering step is predominately oxides of said major constituent.

4. The process of claim 3 wherein said first alloy includes reactive ingredients selected from the group consisting of aluminum, silicon, chromium, beryllium, titanium, gallium, indium, tin, calcium, strontium, barium, boron and combinations thereof, said reactive elements being sufficiently soluble in said alloy whereby said reactive element rapidly diffuses from the alloy to the surface during said heating step to form a refractory oxide film under the first oxide film.

5. The process of claim 4 including the step of providing said lid component with a first cavity in the uncoated area, said first cavity having a surface of said gettering alloy.

6. The process of claim 5 including the step of roughening the surface of said gettering alloy to increase the surface area in contact with the gas constituents in the enclosure.

7. The process of claim 5 including the step of cutting grooves on the surface of said gettering alloy to increase the surface area in contact with the gas constituents in the enclosure.

8. The process of claim 5 including the step of sintering at a temperature of about 350° to about 400° C. for a period of about 10 to about 30 minutes.

9. The process of claim 8 including the step of heating to hermetically seal the enclosure at a temperature of about 400° to about 475° C. for a period of about 5 to about 15 minutes.

10. The process of claim 9 including the step of forming said lid and base components of said gettering alloy.

11. The process of claim 10 including the steps of:
forming said base component of a metallic material; and
forming said lid component of a bi-clad, said bi-clad comprising:
one of the clad layers having said first surface being formed of said gettering alloy; and
the second clad layer being formed of a metal or second alloy having desired physical characteristics.

12. The process of claim 10 including the step of forming said leadframe of a precipitation hardenable, glass sealable alloy.

13. The process of claim 1 including the step of selecting the sealing glass from the group consisting of borate, borosilicate, lead borate, lead borosilicate and phosphate glasses.

14. The process of claim 1 wherein the step of removing the oxide layer includes immersing the surface having the first oxide layer into a pickling solution.

15. The process of forming a package having a hermetically sealed enclosure containing an electrical device, comprising the steps of:
providing a base component having a first surface;
providing a lid component having a first surface comprised of a material selected from the group consisting of metals, alloys, cermets, ceramics, ceramic-glass and ceramic-glass-metal composites;
affixing a strip of a gettering alloy to the first surface of said lid component;
providing a sealing glass composite;
coating the peripheral portion of said first surfaces of said base and lid components with said sealing glass composite leaving an uncoated area in the middle of said first lid and base components;
sintering the coating of sealing glass composite on said base and lid components;
providing a leadframe;
disposing said leadframe on the glass coated surface of said base component;
heating the assembly of said leadframe and the base component whereby the glass coating melts into a continuous glaze which bonds the leadframe to the base component;
substantially removing the oxide layer from said strip of gettering alloy;
electrically interconnecting said electrical component to said leadframe;
stacking said lid component on the assembly of said leadframe and said base component to form the enclosure containing said electrical device, said lid and base components being stacked whereby the glass coating of the lid component contacts the glass coating of the base component; and
heating the assembly of said lid component, said base component and said leadframe to melt the glass coatings on the base and lid components and hermetically seal said enclosure, said heating step for hermetically sealing said enclosure being for a period of time whereby contact of the gas constituents and the gettering alloy within the enclosure results in the amount of oxygen and water vapor within said enclosure to be less than about 100 parts per million and about 1000 parts per million, respectively, of the gas constituents.

16. The process of claim 15 wherein said heating step for hermetically sealing said enclosure being for the period of time so that the amount of water vapor within said enclosure is less than about 150 parts per million of the gas constituents.

17. The process of claim 15 including the step of selecting said gettering alloy of a first alloy capable of forming a continuous refractory oxide layer on its surface, said alloy having the major constituent being selected from the group consisting of copper, nickel, iron and composites thereof whereby a first oxide film formed on the surface of the lid component during the sintering step is predominately oxides of said major constituent.

18. The process of claim 15 wherein said first alloy includes reactive ingredients selected from the group consisting of aluminum, silicon, chromium, beryllium, titanium, gallium, indium, tin, calcium, strontium, barium, boron and combinations thereof, said reactive elements being sufficiently soluble in said alloy whereby said reactive element rapidly diffuses from the alloy to the surface during said heating step to form a refractory oxide film under the first oxide film.

19. The process of claim 18 including the step of roughening the surface of said gettering alloy to increase the surface area in contact with the gas constituents in the enclosure.

20. The process of claim 18 including the step of sintering at a temperature of about 350° to about 400° C. for a period of about 10 to about 30 minutes.

21. The process of claim 20 including the step of heating to hermetically seal the enclosure at a temperature of about 400° to about 475° C. for a period of about 5 to about 15 minutes.

22. The process of claim 21 including the step of forming said base component of said gettering alloy.

23. The process of claim 22 including the step of forming said leadframe of a precipitation hardenable, glass sealable alloy.

24. The process of claim 15 including the step of selecting the sealing glass from the group consisting of borate, borosilicate, lead borate, lead borosilicate and phosphate glasses.

25. The process of claim 24 wherein the step of removing the oxide layer includes immersing the surface having the first oxide layer into a pickling solution.

* * * * *

UNITED STATES PATENT AND TRADEMARK OFFICE
CERTIFICATE OF CORRECTION

PATENT NO. : 4,769,345
DATED : September 6, 1988
INVENTOR(S) : Butt et al

It is certified that error appears in the above—identified patent and that said Letters Patent is hereby corrected as shown below:

Column 10, line 35, please delete "getting" and insert ---gettering---.

Signed and Sealed this

Seventh Day of January, 1992

Attest:

HARRY F. MANBECK, JR.

Attesting Officer

Commissioner of Patents and Trademarks